(12) United States Patent
Hayashi et al.

(10) Patent No.: US 8,558,981 B2
(45) Date of Patent: Oct. 15, 2013

(54) DISPLAY DEVICE AND MANUFACTURING METHOD THEREFOR

(75) Inventors: Hisao Hayashi, Kanagawa (JP); Shigetaka Toriyama, Kanagawa (JP)

(73) Assignee: Japan Display West, Inc., Chita (JP)

( * ) Notice: Subject to any disclaimer, the term of this patent is extended or adjusted under 35 U.S.C. 154(b) by 157 days.

(21) Appl. No.: 12/165,447

(22) Filed: Jun. 30, 2008

(65) Prior Publication Data

US 2008/0273156 A1 Nov. 6, 2008

Related U.S. Application Data

(63) Continuation of application No. 11/103,169, filed on Apr. 11, 2005, now Pat. No. 7,394,514, which is a continuation of application No. 10/448,480, filed on May 30, 2003, now Pat. No. 6,879,368.

(30) Foreign Application Priority Data

May 31, 2002 (JP) ................................ 2002-159040

(51) Int. Cl.
*G02F 1/1345* (2006.01)
(52) U.S. Cl.
USPC ........................................ 349/149; 349/152
(58) Field of Classification Search
USPC ......... 349/149–152, 43, 139; 438/30; 257/57, 257/72
See application file for complete search history.

(56) References Cited

U.S. PATENT DOCUMENTS

| | | | | |
|---|---|---|---|---|
| 5,317,432 A | * | 5/1994 | Ino | ................................. 349/39 |
| 5,995,177 A | * | 11/1999 | Fujikawa et al. | ............... 349/46 |
| 6,104,464 A | | 8/2000 | Adachi et al. | |
| 6,433,841 B1 | * | 8/2002 | Murade et al. | ................... 349/43 |
| 6,480,253 B1 | * | 11/2002 | Shigeta et al. | ................ 349/148 |
| 6,567,148 B1 | | 5/2003 | Akiyama et al. | |
| 6,697,136 B1 | * | 2/2004 | Yasukawa | ...................... 349/113 |
| 7,016,007 B2 | | 3/2006 | Chang et al. | |

FOREIGN PATENT DOCUMENTS

| | | |
|---|---|---|
| JP | 2000-275672 | 10/2000 |
| JP | 2001-194679 | 7/2001 |

* cited by examiner

*Primary Examiner* — Edward Glick
*Assistant Examiner* — David Chung
(74) *Attorney, Agent, or Firm* — Robert J. Depke; The Chicago Technology Law Group, LLC (57) ABSTRACT

Disclosed herein is a display device including a pair of substrates opposed to each other, a pixel region provided between the substrates, and an external wiring provided on an extension of one of the substrates. The external wiring is disposed in a recess formed on the extension. With this structure, the external wiring provided on the extension can be reliably protected to thereby improve the reliability of the display device.

10 Claims, 9 Drawing Sheets

DISPLAY DEVICE AND MANUFACTURING METHOD THEREFOR

The subject matter of application Ser. No. 10/448,480 is incorporated herein by reference. The present application is a continuation of U.S. application Ser. No. 11/103,169, filed Apr. 11, 2005, which is a continuation of U.S. application Ser. No. 10/448,480, filed May 30, 2003, now U.S. Pat. No. 6,879, 368, which claims priority to Japanese Patent Application No. JP2002-159040, filed May 31, 2002. The present application claims priority to these previously filed applications.

BACKGROUND OF THE INVENTION

The present invention relates to a display device having a pair of substrates opposed to each other and a pixel region formed between the substrates, such as a liquid crystal display (LCD) driven by various transistors such as thin film transistors (TFTs), and also relates to a manufacturing method for the display device.

In recent years, a display device has been required to provide high-definition and high-quality display. As a liquid crystal display meeting this requirement, an active matrix type liquid crystal display using TFTs is used. The TFTs are used as switching elements for driving a liquid crystal.

Figure 4:
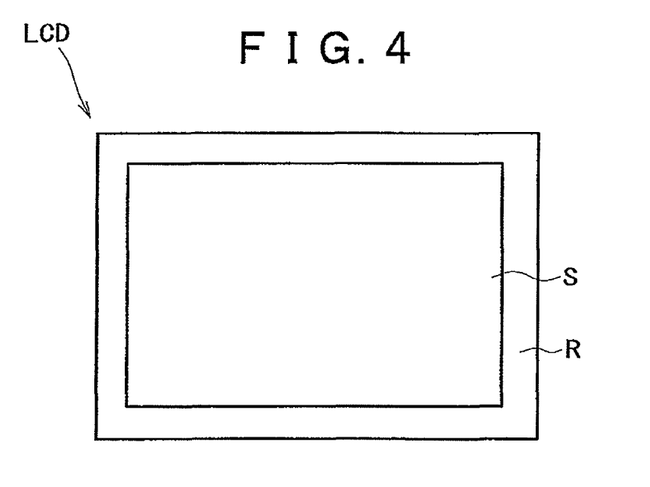
FIG. 4 is a schematic plan view of a liquid crystal display in the related art.

FIG. 4 shows a plan view of a liquid crystal display in the related art. The liquid crystal display includes a pixel region S having a plurality of pixels arranged in a matrix form for displaying an image, and a peripheral circuit region R arranged so as to surround the pixel region S.

Usually, an active matrix type liquid crystal display using TFTs has a control unit for sending a control signal to each TFT and a lead wiring connected to the control unit. In many cases, the lead wiring is located in a region of the liquid crystal display other than the pixel region S, that is, in the peripheral circuit region R. This arrangement is used in many LCDs at present.

The manufacture of an active matrix type liquid crystal display using TFTs is generally classified into a manufacturing process for a drive substrate on which the TFTs are formed and a manufacturing process for another substrate opposed to the drive substrate. These substrates are aligned and attached to each other to define a gap therebetween, and a liquid crystal is filled into this gap.

The drive substrate manufacturing process includes the steps of first forming a silicon oxide file or a silicon nitride film as a gate insulating film of each TFT on a translucent substrate such as a glass substrate, next forming a silicon oxide film or a silicon nitride film as an interlayer insulating film, next forming a metal film of Al (aluminum) as a lead wiring, and finally patterning the metal film to form the lead wiring. Another interlayer insulating film is usually formed over the lead wiring.

Figure 5:
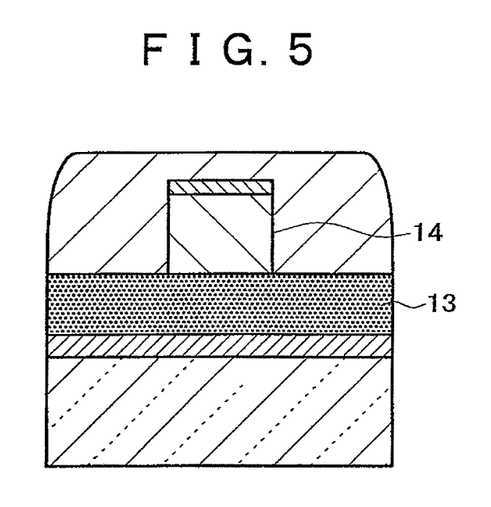
FIG. 5 is an enlarged sectional view showing an example of the arrangement of a lead wiring in the related art.

The lead wiring is formed on the interlayer insulating film covering the TFTs as described in Japanese Patent Laid-open Nos. 2001-242803 and 2001-284592 and Japanese Patent No. 3247793, for example. An example of the arrangement of a conventional lead wiring 14 is shown in FIG. 5. As shown in FIG. 5, the conventional lead wiring 14 is formed on an interlayer insulating film 13. Accordingly, the height of the lead wiring 14 from the substrate is about 0.5 µm to 1 µm in many cases.

Thus, the conventional lead wiring is disposed at a height of about 0.5 µm to 1 µm from the substrate, so that the lead wiring is prone to damage by an external pressure. Particularly in the manufacturing process for an active matrix type liquid crystal display using TFTs, it is necessary to align a pair of substrates (glass substrates) and to remove a part of one of the substrates, so as to provide an extension of the other substrate on which the lead wiring is to be formed. At this time, an undue pressure may be frequently applied to the lead wiring formed on the extension.

Further, in the manufacturing process for an active matrix type liquid crystal display using TFTs, there is a possibility that a worker may touch the lead wiring, causing damage (scratches) to the lead wiring. The damage to the lead wiring may cause a break in the lead wiring during conduction of electricity due to electromigration, temperature, etc., thus leading to a reduction in reliability of the display device.

SUMMARY OF THE INVENTION

It is accordingly an object of the present invention to provide a display device, which can reliably protect the lead wiring provided on the extension from an external pressure.

In accordance with an aspect of the present invention, there is provided a display device including a pair of substrates opposed to each other, a pixel region provided between the substrates, and an external wiring provided on an extension of one of the substrates; the external wiring being disposed in a recess formed on the extension.

In accordance with another aspect of the present invention, there is provided a manufacturing method for a display device having a pair of substrates opposed to each other, a pixel region formed between the substrates, and an external wiring formed on an extension of one of the substrates for inputting a signal to the pixel region. The manufacturing method includes the steps of forming a recess on the extension, and disposing the external wiring in the recess.

With the above configuration of the display device according to the present invention, the recess is formed on the extension of one of the substrates, and the external wiring is disposed in this recess. Accordingly, the external wiring is retracted from the periphery of the recess, so that the external wiring can be protected from an external pressure applied to the extension, thereby preventing an adverse effect of the external pressure on the external wiring.

BRIEF DESCRIPTION OF THE DRAWINGS

These and other objects of the invention will be seen by reference to the description, taken in connection with the accompanying drawing, in which.

DETAILED DESCRIPTION OF THE PREFERRED EMBODIMENTS

Figure 1A:
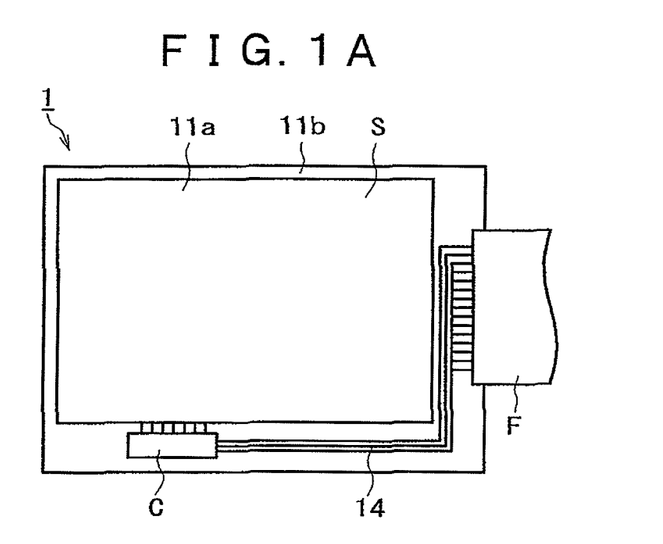
FIG. 1A is a schematic plan view of a display device according to a preferred embodiment of the present invention.
Figure 1B:
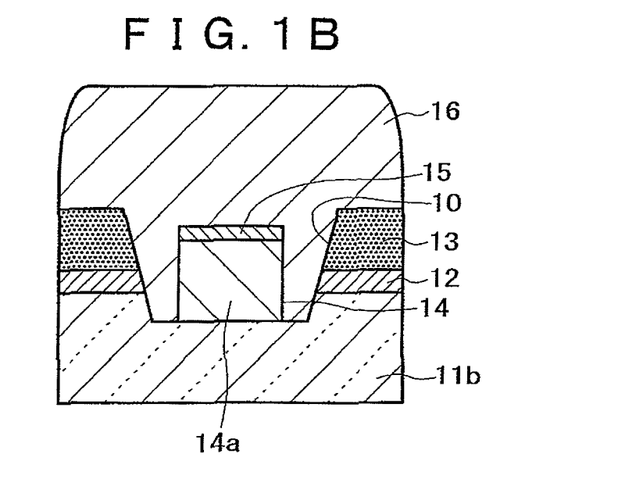
FIG. 1B is an enlarged sectional view of an essential part of the display device shown in FIG. 1A.

A preferred embodiment of the present invention will now be described with reference to the drawings. FIG. 1A is a plan view of a display device 1 according to the preferred embodiment, and FIG. 1B is an enlarged sectional view of an essential part of the display device 1 shown in FIG. 1A.

The display device 1 includes a pair of substrates 11a and 11b opposed to each other, a pixel region S provided between the substrates 11a and 11b, and a lead wiring (external wiring) 14 provided on an extension of one of the substrates 11a and 11b (an extension of the substrate 11b in this preferred embodiment). The display device 1 is an LCD (Liquid Crystal Display) mainly using a liquid crystal for the pixel region S.

The display device 1 according to this preferred embodiment is characterized in that the lead wiring 14 provided on the extension of the substrate 11b is disposed in a trench (recess) 10 formed on this extension.

Further, an integrated circuit C as a circuit element for driving the pixel region S is provided on the extension of the substrate 11b, and a flexible cable F as an external wiring member is electrically connected through the lead wiring 14 to the integrated circuit C. The lead wiring 14 is composed of a plurality of individual leads.

With the configuration that the lead wiring 14 is disposed in the trench 10 formed on the substrate 11b, the lead wiring 14 is retracted from the periphery of the trench 10 into the substrate 11b, thereby allowing protection of the lead wiring 14 from an external pressure.

There will now be described a sectional structure of the lead wiring 14 and its periphery with reference to FIG. 1B. A gate insulating film 12 of $SiO_2/Si_3N_4/SiO_2$ is formed on the substrate 11b such as a glass substrate, and an interlayer insulating film 13 of $SiO_2$ or $Si_3N_4$ is formed on the gate insulating film 12.

The gate insulating film 12 is formed as a gate insulating film of TFTs in the pixel region S as a display region of the display device 1. The gate insulating film 12 is left in a region other than the pixel region S, that is, in a peripheral circuit region.

The trench 10 is formed by partially etching the interlayer insulating film 13 and the gate insulating film 12. Preferably, the depth of the trench 10 extends to the substrate 11b, so that the lead wiring 14 to be disposed later can be formed near the substrate 11b. Furthermore, by etching the substrate 11b such as a glass substrate, the etched surface of the substrate 11b (the bottom of the trench 10) is made rough to thereby improve the adhesion of the lead wiring 14 to the substrate 11b.

The trench 10 can be formed by the same etching process as that for formation of contact holes (through holes) at the TFTs or the peripheral circuit. Accordingly, it is not necessary to add a photolithographic process for formation of the trench 10, but changing of a mask is only necessary.

In this preferred embodiment, the trench 10 is normally tapered so that the top of the trench 10 is wider than the bottom thereof as shown in FIG. 1B. With this configuration, it is possible to avoid a break in the lead wiring 14 due to a sharp step in disposing the lead wiring 14 along the side surface of the trench 10 at the connection between the lead wiring 14 and the integrated circuit C or the flexible cable F.

Each lead constituting the lead wiring 14 is composed of a metal film 14a formed on the bottom of the trench 10 and a barrier metal 15 formed on the upper surface of the metal film 14a so as to fully cover the same. The metal film 14a is formed of Al, Al—Si, Al—Si—Cu, or Cu, for example. The barrier metal 15 is formed of Ti or TiN, for example. By forming the barrier metal 15, the reliability of connection between the lead wiring 14 and the integrated circuit C or the flexible cable F can be improved.

The total thickness of the metal film 14a and the barrier metal 15 is set smaller than the depth of the trench 10. The metal film 14a and the barrier metal 15 serve as the lead wiring 14, so that if the height of the lead wiring 14 from the substrate 11b is large, the lead wiring 14 may be adversely affected by an external pressure in subsequent steps. To avoid this problem, the metal film 14a and the barrier metal 15 are disposed in the trench 10 so that the upper surface of the barrier metal 15 is lower in level than the upper surface of the interlayer insulating film 13.

In modification, the upper surface of the barrier metal 15 may be the same in level as the upper surface of the interlayer insulating film 13. Further, the upper surface of the barrier metal 15 may be the same in level as the upper surface of the gate insulating film 12. Further, the upper surface of the barrier metal 15 may be lower in level than the upper surface of the substrate 11b in the periphery of the trench 10. With this configuration, the metal film 14a and the barrier metal 15 can be more retracted from the periphery of the trench 10, thereby attaining effective protection of the lead wiring 14 from an external pressure that may be applied subsequently.

The distance from the lead wiring 14 to the edge of the bottom of the trench 10 is preferably set in the range of 1 μm to 3 μm. By setting this distance, it is possible to prevent that the lead wiring 14 may be formed outside the trench 10 because of misalignment in a photolithographic process. In addition, an insulating film 16 covering the lead wiring 14 can be formed flat (with planarity).

In modification, the trench 10 may be fully filled with the lead wiring 14. In this case, the upper opening of the trench 10 is closed, so that the workability of spin coating for formation of the insulating film 16 can be improved.

Figure 2A:
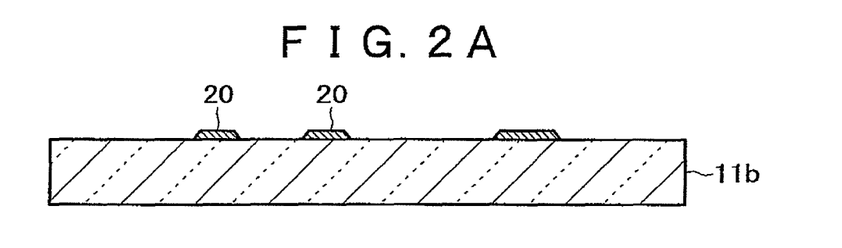
FIGS. 2A to 2G are sectional views for illustrating a manufacturing method of the display device shown in FIG. 1A.

A manufacturing method for the display device 1 according to this preferred embodiment will now be described with reference to FIGS. 2A to 2G. As shown in FIG. 2A, gate electrodes 20 are formed on a substrate 11b such as a glass substrate by sputtering and etching after cleaning the substrate 11b.

Figure 2B:
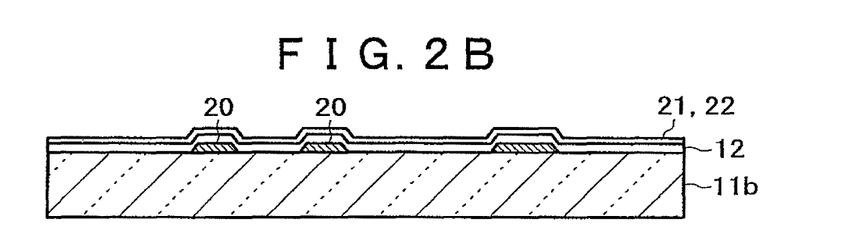

As shown in FIG. 2B, a gate insulating film 12 is next formed on the substrate 11b so as to cover the gate electrodes 20, and an amorphous silicon film 21 is next formed on the gate insulating film 12. The amorphous silicon film 21 is next subjected to laser annealing to form a polysilicon film 22. After forming the polysilicon film 22, ion implantation for formation of LDD (Lightly Doped Drain) regions is performed.

Figure 2C:
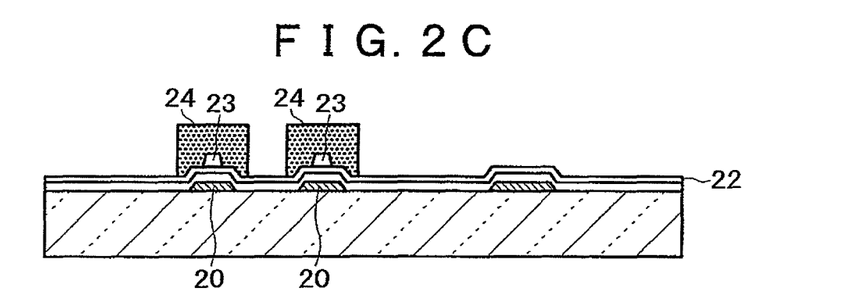

As shown in FIG. 2C, stopper films 23 are next formed on the polysilicon film 22 at positions respectively corresponding to the gate electrodes 20 in a self-aligned fashion with respect to the gate electrodes 20, and resists 24 are next formed on the polysilicon film 22 so as to respectively cover the stopper films 23. Thereafter, ion implantation is performed by using the resists 24 as a mask to form source and drain regions adjacent to the LDD regions.

Figure 2D:
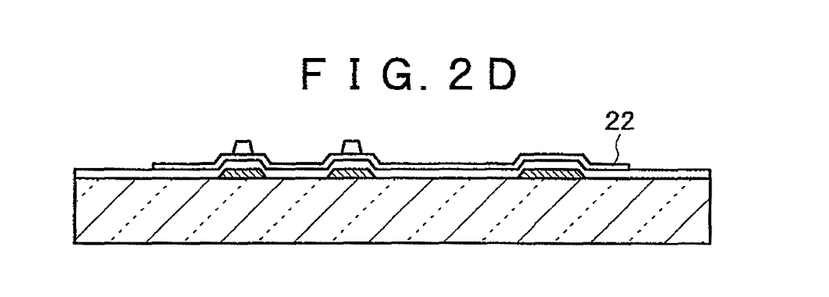
Figure 2E:
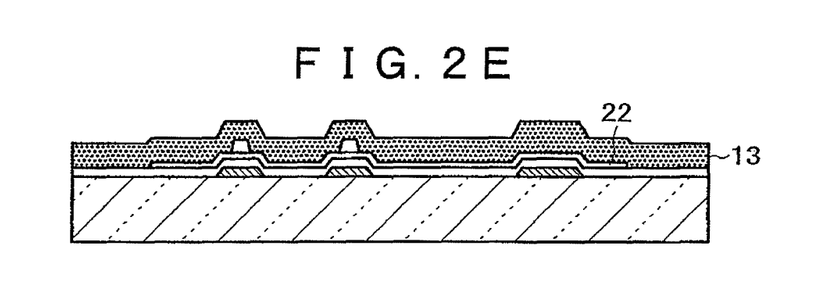

As shown in FIG. 2D, the polysilicon film 22 is etched. Thereafter, an interlayer insulating film 13 is formed over the surface of the polysilicon film 22 by coating as shown in FIG. 2E.

Figure 2F:
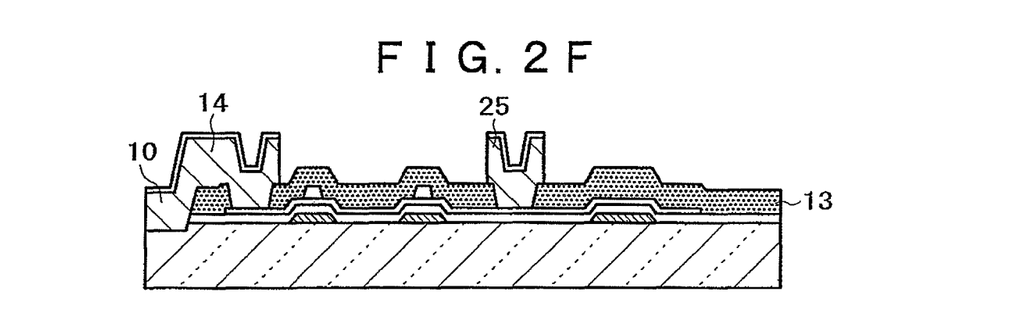

As shown in FIG. 2F, contact holes are formed through the interlayer insulating film 13 at necessary positions by etching. Simultaneously with the etching for formation of the contact holes, a trench 10 is also formed through the interlayer insulating film 13 and the gate insulating film 12 into the surface of the substrate 11b at a position corresponding to a lead wiring 14 to be formed later. After this etching process, a wiring 25 is formed in each contact hole, and the lead wiring 14 is formed in the trench 10 so that the upper surface of the lead wiring 14 becomes lower than the upper surface of the interlayer insulating film 13.

Figure 2G:
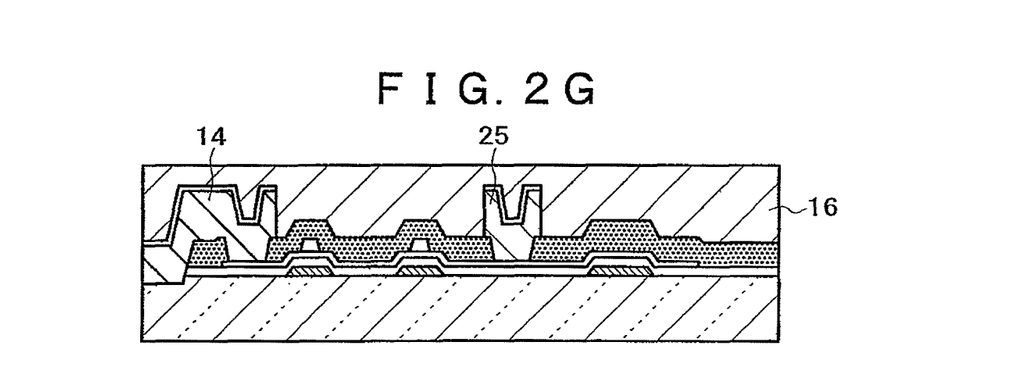

After forming the wiring 25 and the lead wiring 14, an insulating film 16 is formed so as to cover the wiring 25 and the lead wiring 14 as shown in FIG. 2G. Although not shown, a light diffusion surface and a reflection surface are formed on the insulating film 16. Further, an opposing substrate is formed independently of the above drive substrate 11b, and these substrates are next aligned and attached to each other with a gap defined therebetween. Finally, a liquid crystal is filled into this gap to complete the display device 1.

Figure 3A:
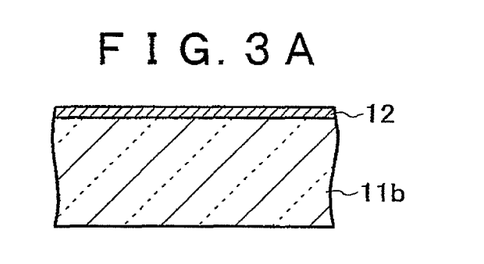
FIGS. 3A to 3I are enlarged sectional views for illustrating a method of forming a lead wiring according to the preferred embodiment.

There will now be described a method of forming the lead wiring 14 with reference to FIGS. 3A to 3I. First, a gate insulating film 12 for TFTs to be formed in a pixel region is formed on a substrate 11b such as a glass substrate by CVD or thermal oxidation (FIG. 3A).

The gate insulating film 12 is a silicon oxide film or a multilayer film formed by sequentially depositing a silicon oxide film, a silicon nitride film, and a silicon oxide film. The gate insulating film 12 has a thickness of 50 nm to 300 nm. The gate insulating film 12 is patterned later by using a photoresist and next etched by dry etching. In this patterning step, the gate insulating film 12 is left in the periphery of a lead wiring forming portion. Alternatively, the gate insulating film 12 may not be left in the periphery of the lead wiring forming portion.

Figure 3B:
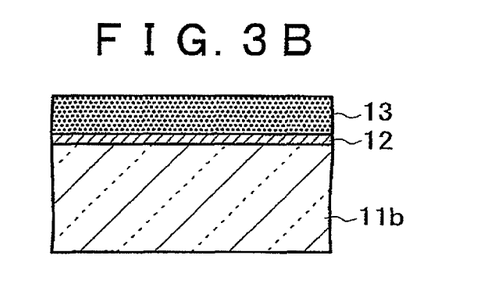

In the next step, an interlayer insulating film 13 is formed directly on the gate insulating film 12 (or on the substrate 11b in the case that the gate insulating film 12 is not left in the periphery of the lead wiring forming portion) by CVD, for example (FIG. 3B). The interlayer insulating film 13 is a film for insulating a transistor such as a TFT from a wiring. The interlayer insulating film 13 has a thickness of 100 nm to 1 μm, normally about 500 nm.

Figure 3C:
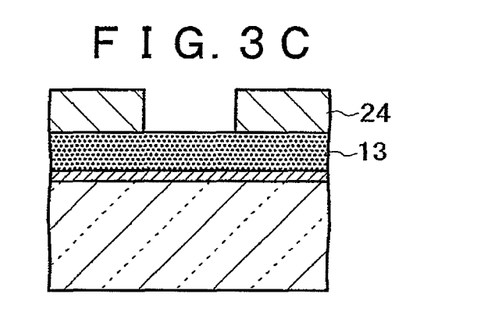

In the next step, a resist 24 is applied over the interlayer insulating film 13 and patterned by exposure and development (FIG. 3C). In this patterning, the pattern width must be set so that the trench 10 can be formed later. Usually, a pattern drawn by CAD is printed on a mask. At this time, the width of the trench 10 is set preferably to the width of the lead wiring 14 plus 2.5 μm, and the applicable range of the width of the trench 10 is the width of the lead wiring 14 plus 1.0 μm to 3.0 μm. In the case that the width of the trench 10 is set to the width of the lead wiring 14 plus 1.0 μm, this width is a lower limit, which can prevent that the lead wiring 14 may be formed outside the trench 10 because of misalignment in a photolithographic process. In the case that the width of the trench 10 is set to the width of the lead wiring 14 plus 3.0 μm, this width is an upper limit, which can prevent that an insulating film 16 to be formed later may lose its flatness after coating. Accordingly, the width of the trench 10 is set preferably in the above range.

In the next step, the interlayer insulating film 13 and the gate insulating film 12 are partially etched to form the trench 10. In this case, the etching is performed at a rate of 50 to 200 nm/min by immersing the insulating films in an HF (hydrofluoric acid) aqueous solution having a concentration of 10% to 20%.

Figure 3D:
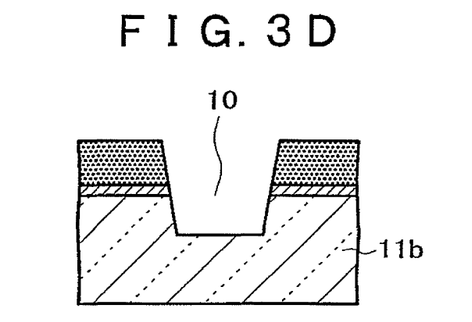

Preferably, this etching is performed so that the depth of the trench 10 extends to the substrate 11b. Accordingly, the lead wiring 14 to be disposed later can be formed near the substrate 11b. Furthermore, by etching the substrate 11b such as a glass substrate, the etched surface of the substrate 11b (the bottom of the trench 10) can be made rough to thereby improve the adhesion of the lead wiring 14 to the substrate 11b.

FIG. 3D shows a cross section in the case that the depth of the trench 10 extends to the substrate 11b in this etching process. In this case, anisotropic etching is performed by immersing the substrate 11b in an HF aqueous solution having a concentration of 10% to 20%.

While the depth of the trench 10 depends on the thickness of the lead wiring 14 to be formed later, a preferable range of the depth of the trench 10 is 0.5 μm to 2.0 μm when the thickness of the lead wiring 14 is 0.5 μm. In the case that the depth of the trench 10 is set to 0.5 μm, this depth is a lower limit, which can prevent that the lead wiring 14 may project from the upper opening of the trench 10. In the case that the depth of the trench 10 is set to 2.0 μm, this depth is an upper limit, which can prevent that the lead wiring 14 may break in forming the lead wiring 14 between the inside of the trench 10 and the outside thereof. Accordingly, the depth of the trench 10 is set preferably in the above range.

The trench 10 can be formed by the same etching process as that for formation of contact holes at the TFTs or the peripheral circuit. Accordingly, it is not necessary to add a photolithographic process for formation of the trench 10.

The trench 10 is normally tapered so that the top of the trench 10 is wider than the bottom thereof as shown in FIG. 3D. With this structure, it is possible to avoid a break in the lead wiring 14 due to a sharp step in disposing the lead wiring 14 along the side surface of the trench 10 at the connection between the lead wiring 14 and the integrated circuit C (see FIG. 1A) or the flexible cable F (see FIG. 1A) both to be subsequently connected to the substrate 11b.

Figure 3E:
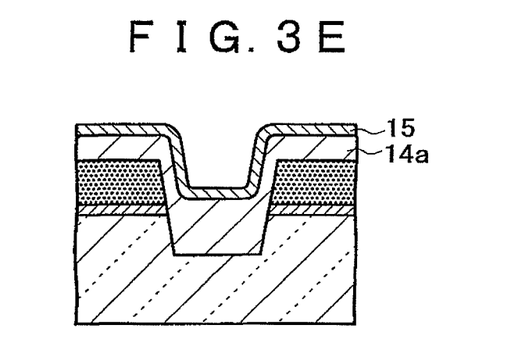

After forming the trench 10, a metal film 14a constituting the lead wiring 14 is formed over the surface of the substrate 11b by sputtering or the like. The metal film 14a is formed of Al, Al—Si, Al—Si—Cu, or Cu, for example. Thereafter, a barrier metal 15 is formed over the surface of the metal film 14a. However, the barrier metal 15 may be omitted. FIG. 3E shows a cross section in the case that the barrier metal 15 is formed.

The barrier metal 15 is formed of Ti or TiN, for example. By forming the barrier metal 15, the reliability of connection between the lead wiring 14 and the integrated circuit C (see FIG. 1A) or the flexible cable F (see FIG. 1A) can be improved. Furthermore, corrosion resistance of the metal film 14a in the case of Al can be improved by the barrier metal 15.

The total thickness of the metal film 14a and the barrier metal 15 is set smaller than the depth of the trench 10. The metal film 14a and the barrier metal 15 serve as the lead wiring 14, so that if the height of the lead wiring 14 from the substrate 11b is large, the lead wiring 14 may be susceptible to an external pressure. To avoid this problem, the metal film 14a and the barrier metal 15 are disposed in the trench 10 so that the upper surface of the barrier metal 15 is lower in level than the upper surface of the interlayer insulating film 13.

Figure 3F:
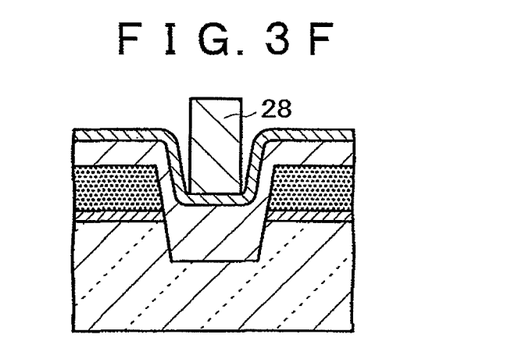
Figure 3G:
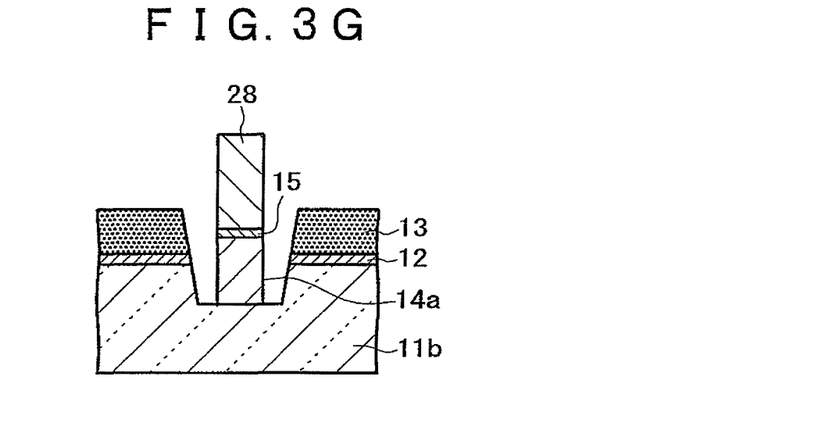
Figure 3H:
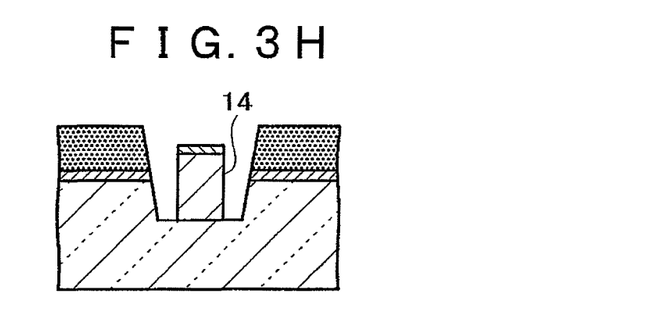

In the next step, a resist 28 is applied over the surface of the barrier metal 15 and patterned by exposure and development so as to mask the barrier metal 15 in the trench 10 (FIG. 3F). Thereafter, anisotropic etching is performed under the following conditions by using the resist 28 as a mask (FIG. 3G). That is, plasma etching is performed by applying a suitable high-frequency power and using Cl2 and BCl3 as etching gases.

The upper surface of the barrier metal 15 may be the same in level as the upper surface of the interlayer insulating film 13. Further, the upper surface of the barrier metal 15 may be the same in level as the upper surface of the gate insulating film 12. Further, the upper surface of the barrier metal 15 may be lower in level than the upper surface of the substrate 11b in the periphery of the trench 10. With this configuration, the metal film 14a and the barrier metal 15 can be more retracted from the periphery of the trench 10, thereby attaining effective protection of the lead wiring 14 from an external pressure that may be applied subsequently. As a result, a break in the lead wiring 14 can be prevented more reliably.

Figure 3I:
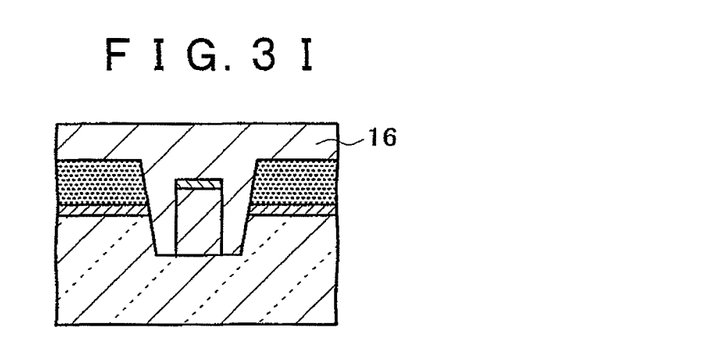

Thereafter, the resist 28 is removed to complete the lead wiring 14 (FIG. 3H), and an insulating film 16 as a protective film is next formed over the surface of the substrate 11b (FIG. 3I). The insulating film 16 is formed mainly by spin coating. Since the lead wiring 14 is disposed in the trench 10 so as to be retracted from the upper surface of the interlayer insulating film 13 as shown in FIG. 3I, the workability of spin coating for formation of the insulating film 16 can be improved.

Thus, the lead wiring 14 can be provided in the trench 10 by the above steps, so that the lead wiring 14 can be reliably protected from an external pressure to thereby prevent damage to the lead wiring 14 and accordingly prevent a break in the lead wiring 14.

While the display device according to the above preferred embodiment is an LCD, the present invention is not limited to the above preferred embodiment, but may be applied to any display devices having such a structure that a pair of substrates are aligned and attached to each other.

According to the present invention as described above, there is provided a display device formed by aligning a pair of substrates, wherein one of the substrates has an extension formed with a recess, and an external wiring is disposed in the recess. With this structure, the external wiring can be reliably protected from an external pressure or the like, thereby preventing damage to the external wiring to prevent a reduction in reliability of the display device.

While a preferred embodiment of the invention has been described using specific terms, such description is for illustrative purposes only, and it is to be understood that changes and variations may be made without departing from the spirit or scope of the following claims.

What is claimed is:

1. A display device comprising a pair of substrates opposed to each other, a pixel region provided between said substrates, and a wiring;
    said wiring being disposed in a recess formed in a trench that extends through a gate insulating layer and an interlayer insulating layer of the display device and at least partially into a surface of the substrate upon which the insulating layer is formed, wherein the trench is located adjacent to an image generating region of the display, the trench extending in a direction perpendicular to the image generating region, the trench being formed such that a base of the trench is wider than a widest portion of the wiring and a top of the wiring is lower than a top of the interlayer insulating layer within which the trench is formed and higher than a top portion of the substrate within which the trench is formed.

2. A display device according to claim 1, wherein the depth of said recess is greater than or equal to the height of said wiring.

3. A display device according to claim 1, further comprising a multilayer thin film formed in the periphery of said recess;
    the depth of said recess extending from said multilayer thin film to said substrate.

4. A display device according to claim 1, further comprising a circuit element;
    said recess being formed between said circuit element and a connected portion of said wiring.

5. A manufacturing method for a display device having a pair of substrates opposed to each other, a pixel region formed between said substrates, and a wiring, said manufacturing method comprising:
    forming a recess that extends through a gate insulating layer and an interlayer insulating layer of the display device and at least partially into a surface of the substrate upon which the insulating layer is formed; and
    disposing said wiring in said recess,
    wherein a metal film of the wiring is formed and a barrier metal is formed on an upper surface of the metal film, and wherein the trench is located adjacent to an image generating region of the display, the trench extending in a direction perpendicular to the image generating region, the trench being formed such that a base of the trench is wider than a widest portion of the wiring and a top of the wiring is lower than a top of the interlayer insulating layer within which the trench is formed.

6. A manufacturing method according to claim 5, further comprising forming through holes in the formation of said pixel region;
    said step of forming said recess being the same as said step of forming said through holes.

7. A manufacturing method according to claim 5, wherein the depth of said recess is greater than or equal to the height of said wiring.

8. A manufacturing method according to claim 5, wherein said display device further has a multilayer thin film formed in the periphery of said recess;
    the depth of said recess extending from said multilayer thin film.

9. A display device according to claim 1, wherein the substrate is glass.

10. A method of manufacturing a display device according to claim 5, wherein the substrate is glass.

* * * * *